United States Patent [19]

Yoshida

[11] Patent Number: 4,846,953
[45] Date of Patent: Jul. 11, 1989

[54] METAL ION SOURCE
[75] Inventor: Yoshikazu Yoshida, Osaka, Japan
[73] Assignee: Matsushita Electric Industrial Co., Ltd., Japan
[21] Appl. No.: 144,464
[22] Filed: Jan. 19, 1988
[30] Foreign Application Priority Data
  Jan. 16, 1987 [JP]  Japan .................................. 62-8491
[51] Int. Cl.$^4$ .............................................. C23C 14/34
[52] U.S. Cl. ................................ 204/298; 204/192.11;
  250/423 R
[58] Field of Search ...................... 204/192.11, 192.12,
  204/298, 298 BD, 298 PI, 298 ME, 298 SG,
  298 PM, 298 CM, 298 MN; 250/398, 423 R,
  425, 492.1, 492.3

[56]  References Cited
  U.S. PATENT DOCUMENTS 4,492,620  1/1985  Matsuo et al. ................. 204/192.12
  4,523,971  6/1985  Cuomo et al. ............. 204/192.12 X
  4,543,465  9/1985  Sakudo et al. ............. 204/192.12 X
  4,559,901 12/1985  Morimoto et al. .......... 204/192.1 X
  4,630,566 12/1986  Asmussen et al. ................. 118/50.1
  4,691,662  9/1987  Koppel et al. ..................... 118/50.1
  4,721,553  1/1988  Saito et al. ..................... 204/192.12

OTHER PUBLICATIONS

"Duoplasmatron and Pig Ion Sources for Heavy Ions", by N. Angert et al, Proc. Int'l Ion Engineering Congress—ISIAT '83 & IPAT '83, Kyoto (1983); pp. 225-230.

Primary Examiner—Nam X. Nguyen
Attorney, Agent, or Firm—Lowe, Price, LeBlanc, Becker & Shur

[57]  ABSTRACT

A sputtering type of a metal ion source includes a microwave radiation means and a pair of magnetic poles to which a negative electric potential is applied. The magnetic pole acts as an electrode for retarding electrons when a sputtering target is placed at the pointed end of the magnetic pole, high density ions generated by the operation of PIG (Penning Ionization Guage) discharge and a magnetic field efficiently bombard and sputter a target, and a microwave discharge acts as an electron supplying source so that a stable discharge is maintained.

4 Claims, 3 Drawing Sheets

METAL ION SOURCE

BACKGROUND OF THE INVENTION

This invention relates to a sputtering type of metal ion source utilizing the electron confining method of PIG (Penning Ionization Gauge) which can be used for an ion beam deposition, an ion implantation, and the like.

It is necessary to supply metal particles to an ion generating chamber when producing metal ion beams. Generally known methods of producing the metal ion beams inclue sputtering and vaporization. In the case of a refractory metal, the method of utilizing sputtering is adopted with advantage, and moreover ion beams of the refractory metal can be comparatrvely easily produced when utilizing the sputtering type of an ion source. For example, according to "N. Angert, R. Keller, and M. Miller: Proc. Int'l Ion Engineering Congress ISITAT '83 & IPAT '83, Kyoto (1983), p. 225.", the conventional sputtering type of the ion source is constructed as shown in FIG. 1. This is the sputtering type of a duoplasmatron ion source made by the combination of the techniques of arc discharge and sputtering.

In FIG. 1, an auxiliary gas such as argon (Ar) is introduced into a cathode chamber 2 through a gas introducing hole 1, and then, arc discharge is generated between a cathode filament 3 and an anode 4. A material to be ionized is placed at a portion of a sputtering electrode 6 to which a negative voltage is applied in an anode chamber 5. When ions generated by the arc discharge flow from the region of the cathode filament 3 to the anode 4, the ions bombard the sputtering electrode 6 having a negative potential, and then, the material is sputtered. The sputtered neutral particles are ionized in the plasma, and taken out by means of an electrode 7 for taking out the ionized material. An intermediate electrode 8 and the anode 4 are made of mild iron so as to form a magnetic path, and a strong axial direction magnetic field, i.e. $10^3$ to $10^4$ gausses, is formed between two electrodes (the intermediate electrode 8 and the anode 4) by a magnetic coil 9 so that the plasma is concentrated in the vicinity of a small aperture of the anode 4 and the ionization rate is improved. Although the mixtures of the ions of the material desired to be ionized and the ions of an auxiliary gas are obtained, these ions are filtrated by a mass separator after they are taken out as ion beams. Numeral 10 denotes a coolant.

However, in the above-mentioned structure, there are problems as described below. The pressure of gas in the ion source is high such as $10^{-2}$ to $10^{-1}$ Torr, and the degree of vacuum of an ion transporting chamber is poor such as $10^{-4}$ Torr. Besides, as a filament is used, the lifetime is short such as 6 to 30 hrs. Moreover, ions are gathered in the vicinity of a central axis by the strong magnetic field so that the sputtering electrode is not sufficiently bombarded.

SUMMARY OF THE INVENTION

The present invention has been developed in order to remove the above-mentioned drawbacks.

It is, therefore, an object of the present invention to provide a metal ion source which can confine electrons by the magnetic field and an electrical field, and which can produce a stable plasma by a microwave discharge, so that metal ion beams of large current are stably attained under a low gas pressure in a long time use.

In accordance with the present invention there is provided a metal ion source comprising: a discharging chamber having an opening for introducing ion species and an opening for drawing out ions; a microwave radiation means for radiating microwaves in the discharging chamber; an electrode for drawing out ions arranged to be connected with an electric potential applying means, and positioned so as to face the opening for drawing out ions at the outside of the discharging chamber; a magnetic field applying means for applying a magnetic field of a direction normal or perpendicular to an ion drawing out direction, and protruding such that a pair of magnetic poles faces each other in the discharging chamber; a pair of sputtering targets placed at both facing pointed ends of a pair of the magnetic poles; and a voltage applying means for applying a negative voltage to the sputtering targets.

The operation of the metal ion source of the present invention will be described hereinbelow.

More specifically, a high density plasma is generated in the discharging chamber by the operation of the microwave and the magnetic field. By the method that sputtering targets are placed at the magnetic poles facing each other so as to attain the above-mentioned magnetic field, and the negative electric potential is applied to the magnetic poles and the sputtering targets, ions in the plasma bombard the sputtering targets. Besides, by the electric potential of the sputtering targets, electrons are confined between the magnetic poles so that the ionization rate of the sputtering material is increased.

As a result, ions more actively bombard the sputtering target by the magnetic field, and at the same time, electrons are confined, so that the ionization rate is increased and ion species of the sputtering material are stably attained in large quantities.

BRIEF DESCRIPTION OF THE DRAWINGS

The present invention will be described in detail by way of illustrative example with reference to the accompanying drawings, in which.

DETAILED DESCRIPTION OF THE INVENTION

Figure 1:
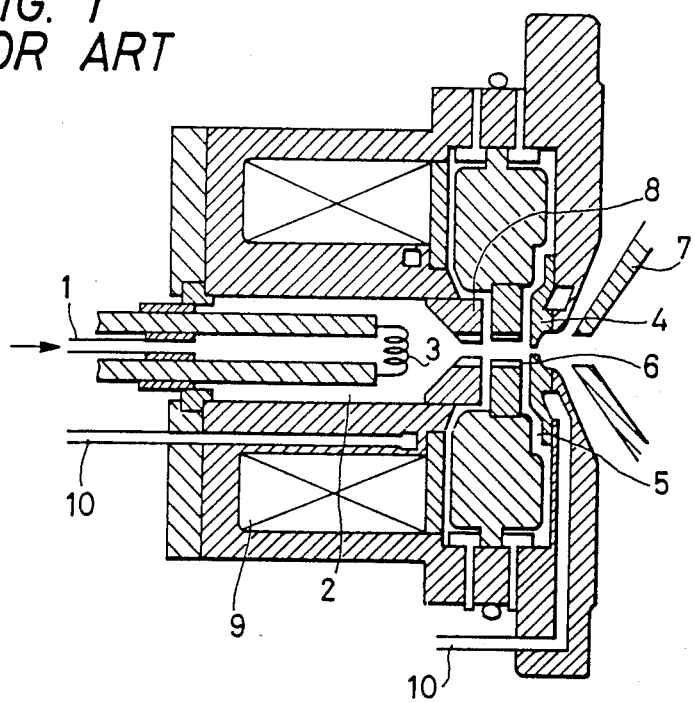
FIG. 1 is a block diagram of a conventional metal ion source.
Figure 2:
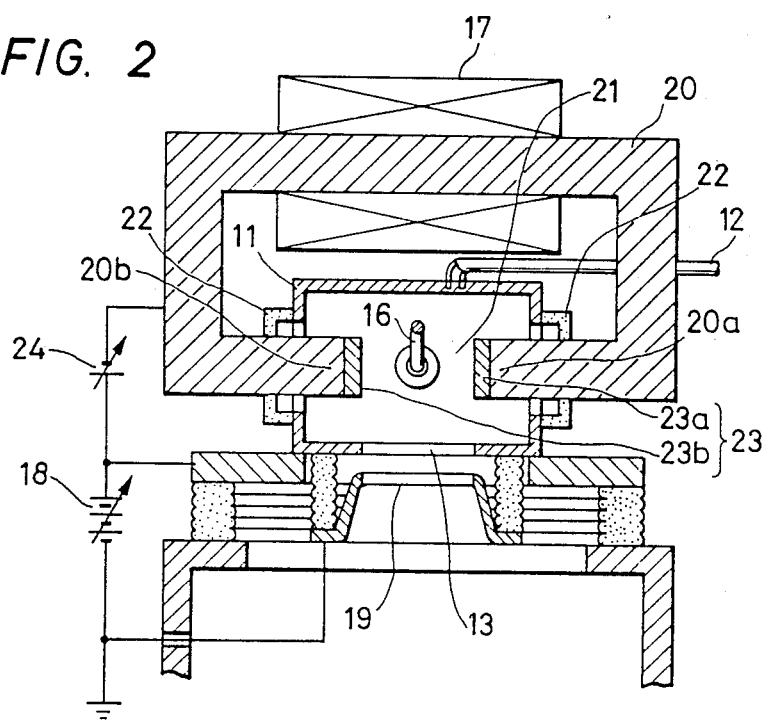
FIG. 2 is a block diagram of a metal ion source of the first embodiment of the present invention.
Figure 3:
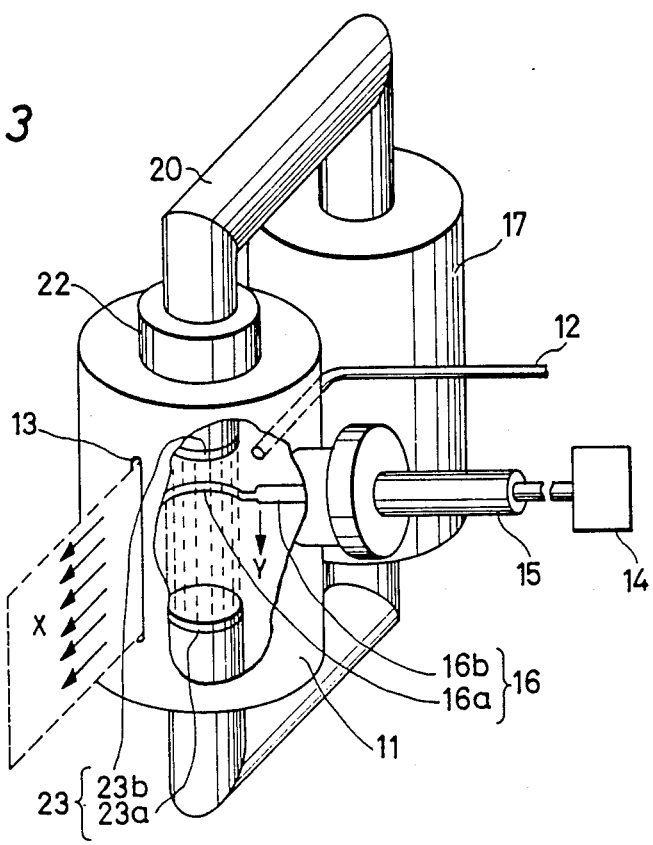
FIG. 3 is a perspective view of the metal ion source of the first embodiment of FIG. 2.

One of the embodiments of the present invention will be described hereinbelow, with reference to the accompanying drawings. In FIG. 2, numeral 11 denotes a discharging chamber having an opening 12 for introducing ion species and an opening 13 for drawing out ions. Microwaves having a frequency of 2.45 GHz, generated by a microwave source 14 shown in FIG. 3 are supplied to a microwave radiation means 16 in the discharging chamber 11 through a cable 15 for introducing the microwave, and then, radiated in the discharging chamber 11. The microwave radiation means 16 comprises a tantalum (Ta) wire having a diameter of 2 millimeters, forming an annular antenna 16a of quarter-wave length having a diameter of 15 millimeters.

The microwave radiation means 16 with its supporter 16b protrudes into the discharging chamber 11.

Numeral 17 denotes a magnetic coil, which forms a magnetic circuit and applies a magnetic field of 1.4 kG in the discharging chamber 11. By the method of introducing gas such as argon (Ar) for maintaining a discharge from the opening 12 for introducing ion species, a plasma having a high density such as $10^{11}$ to $10^{12}/cm^2$ is produced under a low gas pressure such as $10^{-4}$ to $10^{-3}$ Torr in the discharge chamber 11 and a low microwave power such as 30 to 50 Watt by the operation of the microwave and the magnetic field. The ions in the plasma diffuse through the slit-shaped or circular hole-shaped opening 13 for drawing ions out of the discharging chamber 11. The ions are emitted in the direction of the arrow X as shown in FIG. 3 by the electrical field. An electrode 19 having a slit-shaped opening for drawing out ions forms the above-mentioned electrical field by means of an ion accelerating power supply 18.

In order to apply effectively a magnetic force of the magnetic coil 17 to the discharging chamber 11, it is necessary to apply the magnetic field in the direction of arrow Y as shown in FIG. 3 in the discharging chamber 11, using a yoke 20 of a magnetic substance, so that the magnetic circuit having a magnetic gap 21 such as the interval of 18 millimeters is formed. The discharging chamber 11 and the yoke 20 are electrically insulated by an insulation connector 22 having a structure of vacuum seals. A negative voltage can be applied to sputtering targets 23a and 23b placed at the pointed ends, i.e. magnetic poles 20a and 20b, of the yoke 20 relative to the discharging chamber 11 by means of a sputtering power source 24.

Figure 4:
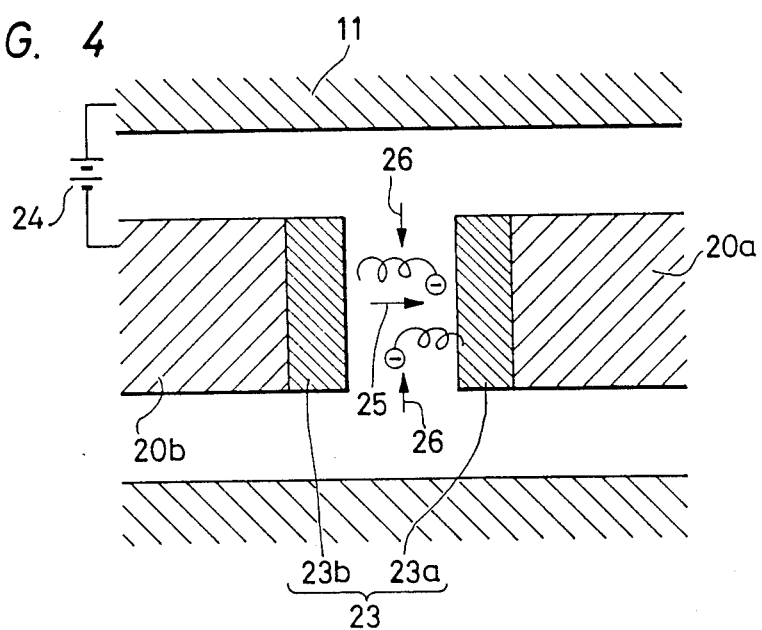
FIG. 4 is an explanatory drawing of the operation in the range of the discharge of the first embodiment.

In the above-mentioned structure, as shown in FIG. 4, ionized electrons can be confined in the discharging chamber 11 by means of the magnetic field 25 having an axial direction and the electrical field 26 having a radial direction. As a result, the electrons can be used to produce the plasma until the electrons exhaust energy thereof by colliding with particles without diffusing to wall surfaces.

Namely, when the strong magnetic field 25 is applied in an axial direction by the magnetic circuit, the electron movement is generally restricted to the direction of the magnetic field 25. More specifically, the electrons move spirally to increase the flight length thereof in a limited space, and electrons are effectively prevented from moving toward the wall surfaces of the discharging chamber 11. By the sputtering power supply 24, the wall surfaces of the discharging chamber 11 have an anode electric potential, and the yoke 20 and the sputtering targets 23a and 23b have a cathode electric potential. As a result, the electric field 26 having a radial direction is obtained, and the sputtering targets 23a and 23b act as retarding electrodes of the electrons so that the electrons are confined in an axial direction by the electrical field 26 having a radial direction. Namely, the electrons are confined in the discharging chamber 11 without diffusing to the wall surfaces by utilizing the magnetic field 25 and the electrical field 26.

When the electric potential of the sputtering targets 23a and 23b is −200 to −300 volts for example, ions generated by a microwave discharge bombard the sputtering targets 23a and 23b neutral particles of the material are sputtered, and the sputtered neutral particles collide with the confined electrons. As a result, the sputtered neutral particles are ionized. In this manner, the ions of the material placed at the sputtering targets 23a and 23b can be obtained. For example, when an auxiliary gas is argon and the intensity of the magnetic field 25 having an axial direction is 1.2 to 2 kG, the Larmor radius of singly charged argon ions is several millimeters or less, and the argon ions are confined between the magnetic poles by the magnetic field. Therefore, the argon ions efficiently bombard the sputtering targets 23a and 23b without diffusing to the wall surfaces so that large amounts of the neutral particles from the sputtering targets 23a and 23b are obtained. At this time, in the case of tantalum (Ta) for example, the Larmor radius of the ions of tantalum (Ta) of the sputtering targets 23a and 23b is tens of centimeter. Therefore, the tantalum (Ta) ions are not confined by the magnetic field so that it is easy to take out the tantalum ions in comparison with the argon ions.

An experiment made using a metal ion source according to the present invention with a well known Faraday cup will be described hereinbelow. Ion beam current is measured by the Faraday cup having an opening diameter of 24 millimeters. The distance between the Faraday cup and the opening 13 for drawing out ions of an ion source test stand having a mass separator is about 1 meter. The amount of ion current of the refractory metal and the ion flux, which are obtained at the same time by the ion source of the present invention, are shown in the table below.

|  | Maximum Ion Current (μA) | Ion Flux ($\times 10^{14}/cm^2 \cdot sec$) |
| --- | --- | --- |
| Ta+ | 115 | 1.6 |
| W+ | 155 | 2.4 |
| Mo+ | 90 | 1.2 |

The experimental conditions are as follows: An auxiliary gas is argon, the pressure of gas in the ion source is $6.2 \times 10^{-3}$ Torr, the diameter of the opening for drawing out ions is 3 millimeters, the voltage for drawing out ions is 12 KV, the microwave electric power is 37 W, and the voltage of the target is −200 to −300 V. The ratio of singly charged tantalum ions to the total ions is about 30%.

Figure 5:
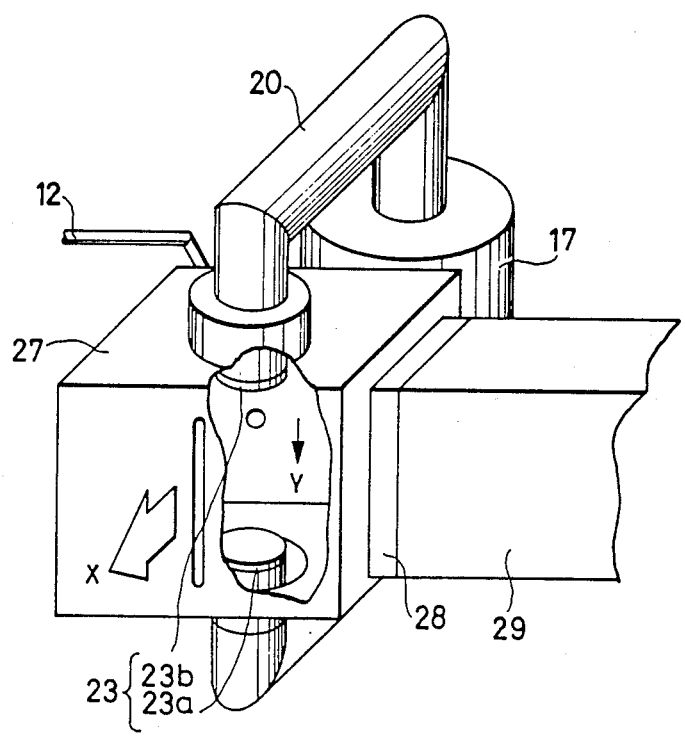
FIG. 5 is a perspective view of the metal ion source of the second embodiment of the present invention.

The second embodiment of the present invention will be described hereinbelow. FIG. 5 shows the second embodiment of the present invention. In this embodiment, numeral 27 denotes the discharging chamber whose structure satisfies the condition of a cavity resonator responding to the microwave, and numeral 28 denotes a window for introducing microwave. The window is attached to the discharging chamber 27, has a vacuum seal structure, and is formed by Pyrex plate for example. Numeral 29 denotes a rectangular waveguide for introducing microwave, and the waveguide is attached to the window 28 for introducing microwave. Besides, the rectangular waveguide 29 is connected to a microwave through a stub tuner, an isolator, or the like (not shown). By this structure, microwave of high power can be introduced so that amount of the metal ions are relatively increased.

The above-described embodiments are only examples of the present invention, and therefore, it will be apparent for those skilled in the art that many modifications and variations may be made without departing from the spirit of the present invention.

What is claimed is:

1. A metal ion source comprising:

(a) a discharging chamber having an opening for introducing ion species and an opening for drawing out ions;
(b) a microwave radiation means for radiating microwaves in said discharging chamber;
(c) an electrodes for drawing out ions, said electrode being arranged to be connected with an electric potential applying means and positioned so as to face said opening for drawing out ions at the outside of said discharging member;
(d) a magnetic field applying means for applying a magnetic field in a direction normal to an ion drawing out direction, and including a pair of magnetic poles having facing ends facing each other in said discharging chamber;
(e) a pair of sputtering targets positioned in said discharging chamber and placed at the facing ends of the pair of said magnetic poles; and
(f) an electric potential applying means for applying a negative electric potential relative to said discharging chamber to said sputtering targets.

2. A metal ion source as claimed in claim 1, wherein said microwave radiation means is an antenna protruding into said discharging chamber in a direction normal to said magnetic field.

3. A metal ion source as claimed in claim 2, wherein said antenna is an annular antenna having a diameter larger than that of said magnetic pole, and less than that of said discharging chamber.

4. A metal ion source as claimed in claim 1, wherein said microwave radiation means includes a waveguide and a window for introducing said microwaves and provided with vacuum seals, said discharging chamber having a structure of a cavity resonator responding to a microwave.

* * * * *